United States Patent [19]

Vaes et al.

[11] Patent Number: 5,512,412
[45] Date of Patent: Apr. 30, 1996

[54] METHOD FOR MAKING A LITHOGRAPHIC PRINTING PLATE

[75] Inventors: Jos Vaes, Betekom; Luc Wabbes, Mortsel, both of Belgium

[73] Assignee: AGFA-Gevaert, N.V., Mortsel, Belgium

[21] Appl. No.: 360,089

[22] Filed: Dec. 20, 1994

[30] Foreign Application Priority Data

Jan. 26, 1994 [EP] European Pat. Off. ............. 94200189

[51] Int. Cl.$^6$ ................................. G03C 8/32; G03F 7/07
[52] U.S. Cl. ........................... 430/204; 430/248; 430/454
[58] Field of Search ..................................... 430/204, 248

[56] References Cited

U.S. PATENT DOCUMENTS

| | | | |
|---|---|---|---|
| 4,563,410 | 1/1986 | De Jaeger et al. | 430/204 |
| 5,324,622 | 6/1994 | Van Rompuy et al. | 430/204 |
| 5,340,691 | 8/1994 | Vaes et al. | 430/204 |
| 5,391,457 | 2/1995 | Hayashi | 430/204 |

*Primary Examiner*—Richard L. Schilling
*Attorney, Agent, or Firm*—Breiner & Breiner

[57] ABSTRACT

The present invention provides a method for making a lithographic printing plate according to the silver salt diffusion transfer process comprising the steps of:

- image-wise exposing an imaging element comprising on a support a photosensitive layer comprising a silver halide emulsion and an image receiving layer containing physical development nuclei,
- developing said imaging element in the presence of developing agent(s) and silver halide solvent(s) using an alkaline processing liquid and
- neutralizing a thus obtained developed imaging element using a neutralization liquid having a pH between 5 and 7 characterized in that said neutralization liquid contains a total concentration of phosphate ions between 0.2 mol/l and 0.4 mol/l.

9 Claims, No Drawings

METHOD FOR MAKING A LITHOGRAPHIC PRINTING PLATE

DESCRIPTION

1. Field of the Invention

The present invention relates to a method for making a lithographic printing plate according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

As for other printing plates it is required that the printing plates obtained according to the DTR-process have a high printing endurance, good ink acceptance in the printing areas and no ink acceptance in the non-printing areas (no staining). It is furthermore desirable, especially for low printing runs, that the number of copies that have to be disposed of because of poor ink acceptance in the printing areas and/or ink acceptance in the non-printing areas during start-up of the printing process is limited. Besides the above requirements the printing plate preferably exhibits a high resolving power.

In order to obtain these required good printing properties with a plate obtained according to the DTR-process, a number of treatments of a developed monosheet DTR-material have been proposed. In EP-A 590,204 it has been proposed to treat a developed monosheet DTR-material with a neutralizing liquid having a pH less than 7 and containing a meso-ionic compound. A reduction in the number of copies that have to be disposed of and an increase of the resolution was found. However, the meso-ionic compounds are expensive and the achieved result is still unsatisfactory.

Neutralizing liquids having a pH around 5.6 possibly containing cysteine have also been used to obtain the objective of decreasing the number of useless copies during startup. Although such neutralizing liquids are effective, they have a inherent low capacity and need to be refreshed frequently. Indeed, when said neutralizing liquids are used to treat a certain amount of developed imaging elements over a longer period of time the then obtained printing plates show a spotty ink acceptance in the printing areas. For economical and ecological reasons and for convenience it is desirable that the capacity of these neutralizing liquids is improved.

3. Summary of the Invention

It is an object of the present invention to provide an economical, ecological and convenient method for making a lithographic printing plate according to the DTR-process having good printing properties i.e. good ink acceptance in the printing areas, no ink acceptance in the non-printing areas and a good resolving power.

Further objects of the present invention will become clear from the description hereinafter.

According to the present invention there is provided a method for making a lithographic printing plate according to the silver salt diffusion transfer process comprising the steps of:

image-wise exposing an imaging element comprising on a support a photosensitive layer comprising a silver halide emulsion and an image receiving layer containing physical development nuclei, developing said imaging element in the presence of developing agent(s) and silver halide solvent(s) using an alkaline processing liquid and neutralizing a thus obtained developed imaging element using a neutralization liquid having a pH between 5 and 7 characterized in that said neutralization liquid contains a total concentration of phosphate ions between 0.2 mol/l and 0.4 mol/l.

4. Detailed description of the invention.

It has been found that with a lithographic printing plate prepared according to the DTR-process and neutralized with a neutralization liquid containing a total concentration of phosphate ions between 0.2 mol/l and 0.4 mol/l, the number of copies that have to be disposed of during start-up of the printing process remains limited even when a sizable amount of developed imaging elements has been treated by said neutralization liquid. However the capacity of the neutralization liquid is severely restricted when it contains a total concentration of phosphate ions outside the indicated range.

The term "total concentration of phosphate ions" represents the sum of the concentrations of phosphoric acid and its salts, metaphosphoric acid and its salts and two times the concentration of pyrophosphoric acid and its salts dissolved in the neutralizing solution regardless of their ionic charge:

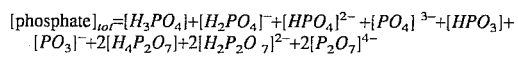
$[phosphate]_{tot}=[H_3PO_4]+[H_2PO_4]^-+[HPO_4]^{2-}+[PO_4]^{3-}+[HPO_3]+[PO_3]^-+2[H_4P_2O_7]+2[H_2P_2O_7]^{2-}+2[P_2O_7]^{4-}$ Preferably the neutralization liquid contains a total concentration of phosphate ions between 0.25 mol/l and 0.35 mol/l.

The neutralizing solution can be prepared by adding one or more of said acids and/or said salts to water or an aqueous solution in an amount giving a total concentration of phosphate ions in accordance with the invention. Preferably phosphoric acid and/or its salts are used.

A pH between 5 and 7 of a neutralization liquid in accordance with the present invention can be obtained by adding, if necessary, alkali or acid or a buffer to said phosphate ions containing solution or by the inverse method or by a mixture of said methods. Preferably the neutralization liquid is prepared by using as pH-regulating substances only a phosphate buffer consisting of a dihydrogenphosphate salt alone or in admixture with a monohydrogenphosphate salt. More preferably the sodium and/or potassium salts of said phosphates are used because of their high solubility in water. However other buffers e.g. a citrate buffer, a carbonate buffer or a borate buffer may added in admixture with a phosphate buffer.

In order to obtain a printing plate with an improved printing latitude a neutralization liquid in accordance with the present invention can contain cysteine, preferably in a concentration between 0.2 g/l and 5 g/l, more preferably in a concentration between 0.5 g/l and 2 g/l.

The neutralization solution can further contain bactericides, e.g. phenol, thymol or 5-bromo-5-nitro-1,3-dioxan as described in EP 150,517. The liquid can also contain substances which influence the hydrophobic / hydrophilic balance of the printing plate obtained after processing of the DTR element, e.g. silica. Further the neutralization solution can contain wetting agents, preferably compounds containing perfluorinated alkyl groups.

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secondary or primary type. Examples of alkanolamines that may be used in connection with the present invention correspond to the following formula:

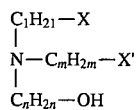

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers are disclosed in e.g. U.S. Pat. No. 4,960,683 and U.S. Pat. No. 5,200,294, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

According to a preferred embodiment of the present invention at least part and most preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/m$^2$, more preferably between 0.1 and 0.5 mmol/m$^2$ and most preferably between 0.5 and 1.5 mmol/m$^2$. More details are disclosed in EP-A-0,554,585

According to the present invention the alkaline processing and/or neutralizing solution preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, U.S. Pat. No. 4,563,410 and EP-A 93201648.8.

According to the present invention the hydrophobizing agents are contained in the alkaline processing and/or neutralizing solution in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/b l.

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc.. Suitable organic alkaline substances are e.g. alkanolamines. In the latter case the alkanolamines will provide or help maintain the pH and serve as a silver halide complexing agent.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. Nos. 3,038,805—4,038,075—4,292,400—4,975,354.

According to the present invention the imaging element can be information-wise exposed in an apparatus according to its particular application, e.g. a conventional process camera containing a conventional light source or a laser containing device.

The imaging element in connection with the present invention for preparing a lithographic printing plate essentially contains on a support in the order given a photosensitive layer containing silver halide and an image receiving layer containing physical development nuclei.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly-(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

The photosensitive layer used in accordance with the present invention comprises at least one photosensitive silver halide emulsion and a hydrophilic colloid binder.

The photographic silver halide emulsion(s) for coating a silver halide emulsion layer in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use in connection with the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used. The emulsions containing more than 5 mole % of silver bromide preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 µm, preferably from 0.25 to 0.45 µm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used-as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Particularly valuable dyes are those belonging to the cyanine dyes, merocyanine dyes, complex merocyanine dyes.

The spectral photosensitivity of the silver halide can also be adjusted for exposure by laser light e.g. helium-neon laser light, argon laser light, and solid state laser light. Dyes that can be used for adjusting the photosensitivity to laser light have been disclosed i.a. in the documents cited in EP-A-93200339.5 and U.S. Pat. No. 5,200,294.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds e.g. phenylmercaptotetrazole, quaternary benzothiazole derivatives, and benzotriazole.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light absorbing dyes are described in i.a. U.S. Pat. No. 4,092,168, U.S. Pat. No. 4,311,787, DE-P 2,453,217.

In an especially preferred embodiment the emulsion layer contained in the imaging element contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved.

More details about the composition, preparation and coating of silver halide emulsions can be found in e.g.

Product Licensing Index, Vol. 92, December 1971, publication 9232, p. 107–109.

Apart from negative-working silver halide emulsions that are preferred for their high light-sensitivity, use can be made also of direct-positive silver halide emulsions that produce a positive silver image.

For instance, direct-positive silver halide emulsions that mainly forms an internal image as described in e.g. EP-A 365,926 and U.S. Pat. No. 3,062,651 may be employed. Alternatively, prefogged direct-positive silver halide emulsions with internal or, more preferably, with external electron traps as disclosed in EP-A 94201899.5 and EP-A 481,562 are also suitable for use in connection with the present invention.

For instance, direct-positive emulsions of the type described in U.S. Pat. No. 3,062,651 may be employed. In direct-positive emulsions a non-hardening fogging agent such as stannous chloride and formamidine sulphinic acid can be used.

The image receiving layer containing physical development nuclei used in accordance with the present invention is preferably free of hydrophilic binder but may comprise small amounts up to 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivity, light reflecting pigments, e.g. titaniumdioxide can be present. This layer can further contain hardening agents, matting agents, e.g. silica particles, and wetting agents. At least part of these matting agents and/or light reflection pigments may also be present in the silver halide emulsion layer, the greater part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric point of the gelatin. But instead of or together with gelatin, use can be made of one or more other natural and/or synthetic and/or semi-synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin and mucohalogenic acids e.g. mucochloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Examples of suitable surface-active agents are described in e.g. EP-A 590.204. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth)acrylates, sulphoalkyl (meth)acrylates, and styrene sulphonic acids.

The present invention will now be illustrated by the following examples without however limiting it thereto. All parts are by weight unless otherwise specified.

EXAMPLE 1

(Comparative example).

Preparation of the silver halide emulsion coating solution.

A silver chlorobromide emulsion composed of 98.2 mol % of chloride and 1.8 mol % of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized by 1-phenyl-5-mercapto-tetrazole.

A base layer coating solution was prepared having the following composition:

| | |
|---|---|
| gelatin | 5.5% |
| carbon black | 0.76% |
| silica particles (5 μm) | 1.6% |

Preparation of the imaging element 1.

The emulsion coating solution and base layer coating solution were simultaneously coated by means of the cascade coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 $g/m^2$ and the gelatin content was 1.5 $g/m^2$. The emulsion layer further contained 0.15 $g/m^2$ of 1-phenyl-4,4'-dimethyl-3-pyrazolidone and 0.25 $g/m^2$ of hydroquinone. The base layer was coated such that the amount of gelatin in the coated layer was 3 $g/m^2$.

The layer nearest to the support of the backing layer pack contained 0.3 $g/m^2$ of gelatin and 0.5 $g/m^2$ of the antistatic agent co(tetraallyloxyethane/methacrylate/acrylic acid-K-salt) polymer. The second backing layer contained 4 $g/m^2$ of gelatin, 0.15 $g/m^2$ of a matting agent consisting of transparent spherical polymeric beads of 3 micron average diameter according to EP 0,080,225, 0.05 $g/m^2$ of hardening agent triacrylformal and 0.021 $g/m^2$ of wetting agent $F_{15}C_7$-$COONH_4$.

The thus obtained element was dried and subjected to a temperature of 40° C. for 5 days and then the emulsion layer was overcoated with a layer containing PdS as physical development nuclei at 0.7 $mg/m^2$, hydroquinone at 0.4 $g/m^2$ and formaldehyde at 100 $mg/m^2$.

Finally the imaging element was cut in sheets.

The following processing solutions were prepared:

| Activator | |
|---|---|
| sodium hydroxide (g) | 30 |
| sodium sulphite anh. (g) | 35 |
| potassium thiocyanate (g) | 20 |
| 2-mercapto-5-n.heptyl-oxa-3,4-diazole (mg) | 150 |
| water to make | 1 l |

| Neutralization solutions | A | B | C | D | E |
|---|---|---|---|---|---|
| $NaH_2PO_4.2H_2O$ (mol./l) | 0.15 | 0.2 | 0.3 | 0.4 | 0.5 |
| $Na_2HPO_4.12H_2O$ (mol.$10^{-2}$/l) | 0.75 | 1 | 1.5 | 2 | 2.5 |
| sodium sulphite anh. | 5 g | id | id | id | id |
| phenol | 50 mg | id | id | id | id |
| cysteine | 1 g | id | id | id | id |
| water to make | 1 l | id | id | id | id |

The pH of these 5 neutralization solutions is 5.60 +/− 0.10.

| Dampening solution | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

The imaging sheets were identically exposed and developed with the above described alkaline activating solution, subsequently neutralized at 25° C. with the neutralization liquid A described above and dried. Without refreshing the processing solutions printing plates were so prepared in a camera platemaker DAINIPPON SP 410, marketed by DAINIPPON Ltd, Japan, at an amount of 10 $m^2$ a day for a period of 12 days.

In a similar way printing plates were prepared by substituting the neutralization solution A by the neutralization solutions B, C, D and E.

The printing plates thus prepared at diverse days were mounted on an offset printing machine AB DICK 985, marketed by AB Dick Co, USA, equipped with a Aquamatic dampening system, marketed by AB Dick CO, USA, and were printed under identical conditions. The above mentioned dampening solution was used at a 5% concentration for fountain solution. The ink used was ABD 1020, marketed by AB Dick Co, USA.

Evaluation:

The effect of the exhaustion of the neutralization solutions in function of their composition on the number of copies that had to be disposed of at the start of the printing process because of spotty ink acceptance in the printing areas is given in table 1.

TABLE 1

| Neutralisation solution | $1^{th}$ day | $6^{th}$ day | $12^{th}$ day |
|---|---|---|---|
| A | 10–15 | >100 | — |
| B | 10–15 | 15–20 | 95–100 |
| C | 10–15 | 15–20 | 20–25 |
| D | 10–15 | 15–20 | 50–55 |
| E | 10–15 | 50–55 | >100 |

This number is low when the freshly prepared neutralization liquids A–E were used. However, after using these neutralization solutions for 5 days this number remains low when using the neutralization solutions B, C and D (solutions according to the invention) but becomes high respectively unacceptable high when using the neutralization solutions E and A (comparative solutions). After using these neutralization solutions for 11 days this number remains low when using the neutralization solution C but becomes high respectively unacceptable high when using the neutralization solutions B and D, resp. A and E.

EXAMPLE 2

(Comparative example).

Preparation of the imaging element 2.

An imaging element 2 was prepared similar to the imaging element 1 with the exception that the emulsion coating solution and the base layer coating solution were coated on one side of a paper support weighting 135 $g/m^2$, coated on both sides with polyethylene, provided with a backing layer and having been subjected to corona discharge.

The printing plates were prepared, used for printing and evaluated similar to the procedure of example 1 with the differences that as neutralization solutions the neutralization solutions C and F were used and that the processing solutions were used for a period of 16 days without refreshment. The neutralizing solution F is identical with E (see example 1) with the exception that it contains 0.45 mol/l $NaH_2PO_4.2H_2O$ and $2.25.10^{-2}$ mol/l $Na_2HPO_4.12H_2O$.

Evaluation:

The results obtained are given in table 2.

TABLE 2

| | Neutralization solution | |
|---|---|---|
| Time | C | F |
| $1^{th}$ day | 10–12 | 10–12 |
| $5^{th}$ day | 10–15 | 15–20 |
| $10^{th}$ day | 15–20 | 25–30 |

TABLE 2-continued

| | Neutralization solution | |
|---|---|---|
| Time | C | F |
| 12$^{th}$ day | 20–25 | 50–55 |
| 14$^{th}$ day | 20–25 | >100 |
| 16$^{th}$ day | 45–50 | — |

It is clear that the detrimental influence of the exhaustion of the neutralization solutions on the number of copies that had to be disposed of at the start of the printing process because of spotty ink acceptance in the printing areas is much less for the neutralization solution C (solution according to the invention) than for the neutralization solution F (comparative solution).

EXAMPLE 3

(Comparative example).

Of the imaging elements 1 and 2 printing plates were prepared and used for printing similar to the procedure of example 2 with the differences that printing plates were so prepared at an amount of 20 m$^2$ a day for a period of 5 days. Evaluation:

At the end of the 5th day the obtained printing plates were inspected on the presence of spots which hamper the visual assessment of the plate without however interfering with its printing properties. These printing plates were then used for printing, whereby the 100th copy obtained was evaluated for printing quality, particularly for the presence of white spots in the printed areas due to soiling of the printing plate and/or the printing equipment. The qualitative evaluation was expressed on a scale from 0 to 3:

0: complete failure-free
1: few and slight failures
2: failures
3: heavy failures The results are given in table 3.

TABLE 3

| Neutralizing Solution | Imaging element 1 | | Imaging element 2 | |
|---|---|---|---|---|
| | Plate | Copy | Plate | Copy |
| F | 3 | 3 | 2 | 3 |
| C | 0 | 0–1 | 0 | 0–1 |

It is clear that the detrimental influence of the exhaustion of the neutralization solutions on the visual assessment and on the printing quality of the obtained printing plate is much less for the neutralization solution C (solution according to the invention) than for the neutralization solution F (comparative solution).

We claim:

1. A method for making a lithographic printing plate according to the silver salt diffusion transfer process comprising the steps of:

image-wise exposing an imaging element comprising on a support in the order given a photosensitive layer comprising a silver halide emulsion and an image receiving layer containing physical development nuclei, developing said imaging element in the presence of developing agent(s) and silver halide solvent(s) using an alkaline processing liquid and neutralizing a thus obtained developed imaging element using a neutralization liquid having a pH between 5 and 7 characterized in that said neutralization liquid contains a total concentration of phosphate ions between 0.2 mol/l and 0.4 mol/l.

2. A method according to claim 1 wherein said total concentration of phosphate ions is comprised between 0.25 mol/l and 0.35 mol/l.

3. A method according to claim 1 wherein said neutralization liquid further comprises cysteine.

4. A method according to claim 1 wherein said neutralization liquid further comprises a hydrophobizing agent.

5. A method according to claim 1 wherein said alkaline processing liquid comprises a thiocyanate salt.

6. A method according to claim 1 wherein said alkaline processing liquid comprises a thioether compound.

7. A method according to claim 1 wherein said alkaline processing liquid comprises a meso-ionic compound.

8. A method according to claim 1 wherein said alkaline processing liquid comprises an alkanolamine.

9. A method according to claim 1 wherein said alkaline processing liquid comprises a hydrophobizing agent.

* * * * *